United States Patent [19]
Koyama

[11] Patent Number: 5,530,843
[45] Date of Patent: Jun. 25, 1996

[54] LOGIC DESCRIPTION CONVERSION APPARATUS AND A LOGIC DESCRIPTION CONVERSION METHOD

[75] Inventor: Masayuki Koyama, Itami, Japan

[73] Assignee: Mitsubishi Denki Kabushiki Kaisha, Tokyo, Japan

[21] Appl. No.: 207,204

[22] Filed: Mar. 8, 1994

[30] Foreign Application Priority Data

Mar. 10, 1993 [JP] Japan ..................... 5-049247

[51] Int. Cl.$^6$ ...................... G06F 15/60
[52] U.S. Cl. .............. 395/500; 364/489; 364/491
[58] Field of Search ...................... 364/488, 489, 364/490, 491; 395/500; 371/3, 20.4, 21.2, 23, 27

[56] References Cited

U.S. PATENT DOCUMENTS

| | | | |
|---|---|---|---|
| 4,703,435 | 10/1987 | Darringer et al. | 364/489 |
| 4,922,432 | 5/1990 | Kobayashi et al. | 364/490 |
| 5,029,102 | 7/1991 | Drumm et al. | 364/489 |
| 5,067,091 | 11/1991 | Nakazawa | 364/490 |
| 5,146,583 | 9/1992 | Matsunaka et al. | 395/500 |
| 5,191,541 | 3/1993 | Landman et al. | 364/578 |
| 5,287,289 | 2/1994 | Kageyama et al. | 364/489 |
| 5,345,393 | 9/1994 | Ueda | 364/489 |
| 5,396,435 | 3/1995 | Ginetti | 395/500 |

FOREIGN PATENT DOCUMENTS

| | | |
|---|---|---|
| 0520708 | 12/1992 | European Pat. Off. |
| 3-84676 | 4/1991 | Japan . |
| 3-185567 | 8/1991 | Japan . |

OTHER PUBLICATIONS

EDN Electrical Design News, vol. 38, No. 21, pp. 111–114, 116, and 120, Oct., 1993, Randy Crane, "HDLS Extend Logic–Design, Not Replace Them".

Wescon Confernce Record, vol. 36, pp. 650–660, Nov., 1992, Naeem Zafar, "Computer–Aided Prototyping For ASIC–Based Systems".

Wescon Conference Record, vol. 34, pp. 382–387, Nov., 1990, Paul D. Lindmann, "Top–Down Design Synthesis Using VHDL".

Primary Examiner—Kevin J. Teska
Assistant Examiner—Tan Nguyen
Attorney, Agent, or Firm—Oblon, Spivak, McClelland, Maier & Neustadt

[57] ABSTRACT

A logic description conversion apparatus and a logic description conversion method are obtained according to which logic descriptions which include a long-term operation logic part which operates at an operation clock which is longer than a reference operation clock are converted into more advanced logic descriptions from which a logic circuit is accurately created. A source code which is formed by logic descriptions which includes a multi-clock transfer path (long-term operation logic part), is generated to a reference table which includes information about input control logic of an extracted register. Based on an indicator in which register name information of a receiving side of the multi-clock transfer path is registered and the reference table, the source code is converted into a source code which is formed by logic descriptions in which the long-term operation logic part and the input control logic are logically separated from each other. Since the long-term operation logic part and the input control logic are logically separated from each other, a logic circuit is accurately created by logic synthesis.

8 Claims, 16 Drawing Sheets

| | REFERENCE TABLE | | ← D1 |
|---|---|---|---|
| REGISTER NAME | INPUT CONTROL CONDITION OF EACH REGISTER | INPUT DATA CORRESPONDING TO INPUT CONTROL CONDITION | |

| REGISTER NAME | REFERENCE TABLE | | — D1 |
|---|---|---|---|
| | INPUT CONTROL CONDITIONS FOR EACH REGISTER | INPUT DATA WHICH CORRESPONDS TO INPUT CONTROL CONDITIONS | |
| reg-B | ST [3] == 1' b1 | functionlogicALU | |

| DEVICE INDICATOR | — D2 |
|---|---|
| REGISTER NAME | |
| reg-B | |

FIG. 11

```verilog
module mainroutineC (regB. DATAIN, clk) ;
input [31:0] DATAIN;
input          clk;
output [31:0] regB;
reg [31:0] regA, regB;
reg [3:0] ST;

always@ (posedge clk) begin
   case (1' b1)
     ST [0] :begin
           regA=DATAIN;
           ST [3:0]=4' b0010;
           end
     ST [1] :ST [3:0]=4' b0100;
     ST [2] :ST [3:0]=4' b1000;
     ST [3] :begin
        regB [31:0]=functionlogicALU (regA [31:0] ) ;

ST [3:0]=4' b0001;
        end
   endcase
end function [31:0] functionlogicALU;
input [31:0]indate;

begin
    functionlogicALU=indate [15:0]+indate [31:16];
  end endfunction endmodule
```

FIG. 12

```
module subroutineA (ALU, ST3, DATAIN, clk) ;
input [31:0] DATAIN;
input         clk;
output [31:0] ALU;
output     ST3;
reg [31:0] regA;
reg [3:0] ST;

assign ST3=ST[3];
assign ALU[31:0]=functionlogicALU (regA[31:0]);

always@ (posedge clk) begin
   case (1' b1)
   ST [0] :begin
           regA=DATAIN;
           ST [3:0]=4' b0010;
           end
   ST [1] :ST [3:0]=4' b0100;
   ST [2] :ST [3:0]=4' b1000;
   ST [3] :ST [3:0]=4' b0001;
   endcase
end function [31:0] functionlogicALU;
input [31:0]indate;

begin
    functionlogicALU=indate [15:0]+indate [31:16];
  end endfunction endmodule
```

FIG. 13

```
module subroutineB (regB, ST3, ALU, clk) ;
input ST3, clk;/* ST3 ST [3]*/
input [31:0] ALU;
output [31:0] regB;
reg [31:0] regB;

always@ (posedge clk) begin
    if (ST3)
        regB [31:0]=ALU [31:0];
  end endmodule
```

FIG. 14

```
module mainroutineA (regB, DATAIN, clk) ;
input [31:0] DATAIN;
input        ckl;
output [31:0] regB;

wire         ST3;
wire [31:0]  ALU;

subroutineA instance No1 (ALU, ST3, DATAIN, clk);
subroutineB instance No2 (regB, ST3, ALU, clk);

endmodule
```

5,530,843

LOGIC DESCRIPTION CONVERSION APPARATUS AND A LOGIC DESCRIPTION CONVERSION METHOD

BACKGROUND OF THE INVENTION

1. Field of the Invention

The present invention relates to a logic description conversion apparatus for and a logic description conversion method of converting a logic description into a more accurate logic description.

2. Description of the Prior Art

In a conventional technique of synthesizing logic, in general, optimum logic is synthesized from a logic description by register extraction means for extracting a corresponding register, Boolean means for processing the logic description by Boolean computation and logic optimization means for optimizing, based on circuit information and timing information for logic optimization, the Boolean logic descriptions which were created by the Boolean means.

In the following, an operation of the present invention will be described in detail. The register extraction means extracts a part of logic descriptions which is described in the register format as a register. Then, the Boolean means processes logic descriptions which are sandwiched between registers or included in a range which is partitioned by input/output ports, that is, logic descriptions other than registers. During the process performed by the Boolean means, whether the logic descriptions are logic of a control computation family or logic of a data computation family (i.e., data transfer family) is not examined. Following this, the logic optimization means optimizes the logic in accordance with the circuit information and the timing information for logic optimization, to thereby generate a logic circuit having optimized logic descriptions.

In the conventional logic synthesis technique, since the Boolean means processes logic descriptions without distinguishing logic descriptions of the control computation family and logic descriptions of the data computation family, if logic synthesis is to be performed on logic descriptions including a sequence circuit, all computation on logic sandwiched between registers must finish within the frequency of a predetermined reference operation clock.

However, as shown in the timing chart of FIG. 17, in reality, while logic computation is carried out at a one-clock frequency T, i.e., the frequency of a reference operation clock, data computation functionlogic ALU between a register reg-A and a register reg-B occasionally requires an especially long three-clock frequency 3T. The data computation family such as the functionlogic ALU is called a multi-clock transfer path in which register-to-register data transfer is not completed within a one-clock frequency but a computation time lingers over a multi-clock period. In FIG. 17, indicated at ST is input control logic of a register, which is formed in correspondence to a register and shows a register load-in enable condition.

FIG. 18 shows a circuit which operates at the timing which is shown in FIG. 17. In FIG. 18, indicated at CLK is a clock input and indicated at DATAIN is a data input. An input control logic group 11 is a logic group which includes ST[0] to ST[3] of FIG. 18. Indicated at reference numeral 12 is a logic group which includes the functionlogic ALU while indicated at reference numeral 13 is a logic group which is controlled by the input control logic ST[0].The registers reg-A and reg-B are basically formed in the D-flip-flop structure. The reference operation clock for the logic circuit shown in FIG. 18 is the one-clock T.

As shown in FIG. 18, the logic group 12 includes the functionlogic ALU of the data computation family and a selector 14 controlled by the input control logic ST[3] of the control computation family. In accordance with ST[3] which is received from an input part P1, the selector 14 selects one of signals which are received from input parts P2 and P3 and outputs the selected signal to a D-input of the register reg-B. The signal which is obtainable from the input part P2 is a Q-output of the register reg-B, and the signal which is obtainable from the input part P3 is a computation result of the functionlogic ALU.

However, with the current logic synthesis technique, it is impossible to control generation of a timing of the selector 14 which is formed in the logic group 12. Hence, if the selector 14 is generated at a relatively early timing point in the three-clock period 3T of the functionlogic ALU of the logic group 12, the signal available from the input part P3 (i.e., a computation result of an unascertained functionlogic ALU) could be selected by the selector 14 before a computation result of the functionlogic ALU is yielded.

In this manner, with the current logic synthesis technique, if logic synthesis is performed on a logic description which includes a multi-clock transfer path which is longer than the reference operation clock, a resulting logic circuit will be different from what is demanded by the specifications, on the contrary to the intention of a designer of the circuit, e.g., the resultant logic circuit could have an extremely slow operation speed.

SUMMARY OF THE INVENTION

In an aspect of the present invention, a logic description conversion apparatus for converting logic descriptions from which a logic circuit will be formed by logic synthesis into higher level logic descriptions from which a logic circuit as it is exactly defined in specifications will be created comprises: logic description providing means for providing first logic descriptions which define at least one long-term operation logic part which performs data computation at a clock which is longer than a reference operation clock; long-term logic input register information providing means for providing long-term logic input register information which designates a register which has the long-term operation logic part at a receiving side of registers which are defined by the first logic descriptions as a long-term logic input register; extracted register input control information generating means for extracting a description which will serve as a register from the first logic descriptions as an extracted register and for generating extracted register input control information in which the extracted register is made correspondence to input control logic which designates an input timing and the like for the extracted register; and logic description conversion means for converting the first logic descriptions into second logic descriptions based on the long-term logic input register information and the extracted register input control information and outputting the second logic descriptions, the second logic descriptions being logic descriptions in which the input control logic of the long-term logic input register and the long-term operation logic part of a receiving side of the long-term logic input register are logically separated from each other.

Preferably, the long-term logic input register information consists of a name which specifies the extracted register, information about the input control logic of the extracted register and input data to be given to the extracted register.

Preferably, the logic description providing means comprises first memory means in which the first logic descriptions are stored and the long-term logic input register information providing means comprises second memory means in which the long-term logic input register information is stored. The logic description conversion apparatus further comprises third memory means for temporarily storing the extracted register input control information.

Preferably, the logic description conversion apparatus is formed by a microcomputer, the extracted register input control information generating means is a CPU which operates in accordance with a preliminarily prepared first program, and the logic description conversion means is the CPU which operates in accordance with a preliminarily prepared second program.

The logic description conversion apparatus may further comprise fourth memory means in which the first and the second programs are stored.

Preferably, the first and the second memory means are RAMs, the third memory means is a hard disk, the fourth memory means is a ROM, and the first, the second and the fourth memory means and the CPU are formed as one computation processing part of a single chip.

The present invention is also directed to a logic description conversion method of converting logic descriptions from which a logic circuit will be formed by logic synthesis into higher level logic descriptions from which a logic circuit as it is exactly defined in specifications will be created. The method comprises the steps of: (a) extracting a description which will serve as a register from the first logic descriptions as an extracted register and for generating extracted register input control information in which the extracted register is made correspondence to input control logic which designates an input timing and the like for the extracted register; and (b) based on long-term logic input register information, which designates a register which has the long-term operation logic part at a receiving side of registers which are defined by the first logic descriptions as a long-term logic input register, and the extracted register input control information, converting the first logic descriptions into second logic descriptions in which the input control logic of the long-term logic input register and the long-term operation logic part of a receiving side of the long-term logic input register are logically separated from each other.

Preferably, the step (a) comprises the steps of: (a-1) extracting a description which will serve as a register from the first logic descriptions as an extracted register; (a-2) extracting information about the input control logic of the extracted register; (a-3) extracting input data to be given to the extracted register; and (a-4) outputting the extracted register input control information in which the extracted register, the information about the input control logic and the input data are stored as a set.

As heretofore described, in the logic description conversion apparatus according to the present invention, the logic description conversion means converts the first logic descriptions into the second logic descriptions, in which the input control logic of the long-term logic input register and the long-term operation logic part of a receiving side of the long-term logic input register are logically separated from each other, based on long-term logic input register information and the extracted register input control information. Hence, during logic synthesis using the second logic descriptions, logic synthesis will not be performed with the input control logic and the long-term operation logic part having different operation clocks existing mixed.

Therefore, even if the second logic descriptions include a long-term operation logic part which operates at an operation clock which is longer than a reference operation clock, a logic circuit will be accurately synthesized from the second logic descriptions by logic synthesis.

Similarly, in the logic description conversion method according to the present invention, at the step (b), based on long-term logic input register information, which designates a register which has the long-term operation logic part at a receiving side of registers which are defined by the first logic descriptions as a long-term logic input register, and the extracted register input control information, the first logic descriptions are converted into second logic descriptions in which the input control logic of the long-term logic input register and the long-term operation logic part of a receiving side of the long-term logic input register are logically separated from each other. Hence, during logic synthesis using the second logic descriptions, logic synthesis will not be performed with the input control logic and the long-term operation logic part having different operation clocks existing mixed.

Therefore, even if the second logic descriptions include a long-term operation logic part which operates at an operation clock which is longer than a reference operation clock, a logic circuit will be accurately synthesized from the second logic descriptions by logic synthesis.

Accordingly, it is an object of the present invention to offer a logic description conversion method of and a logic description conversion apparatus for converting a logic description which includes a long-term operation logic part such as at a multi-clock transfer path which operates at an operation clock which is longer than a reference operation clock into a more sophisticated logic description from which a logic circuit as it is exactly defined in specifications will be created by logic synthesis.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 11 to 14 are views showing an example of an actual source code language;

DESCRIPTION OF THE PREFERRED EMBODIMENTS

Figure 1:
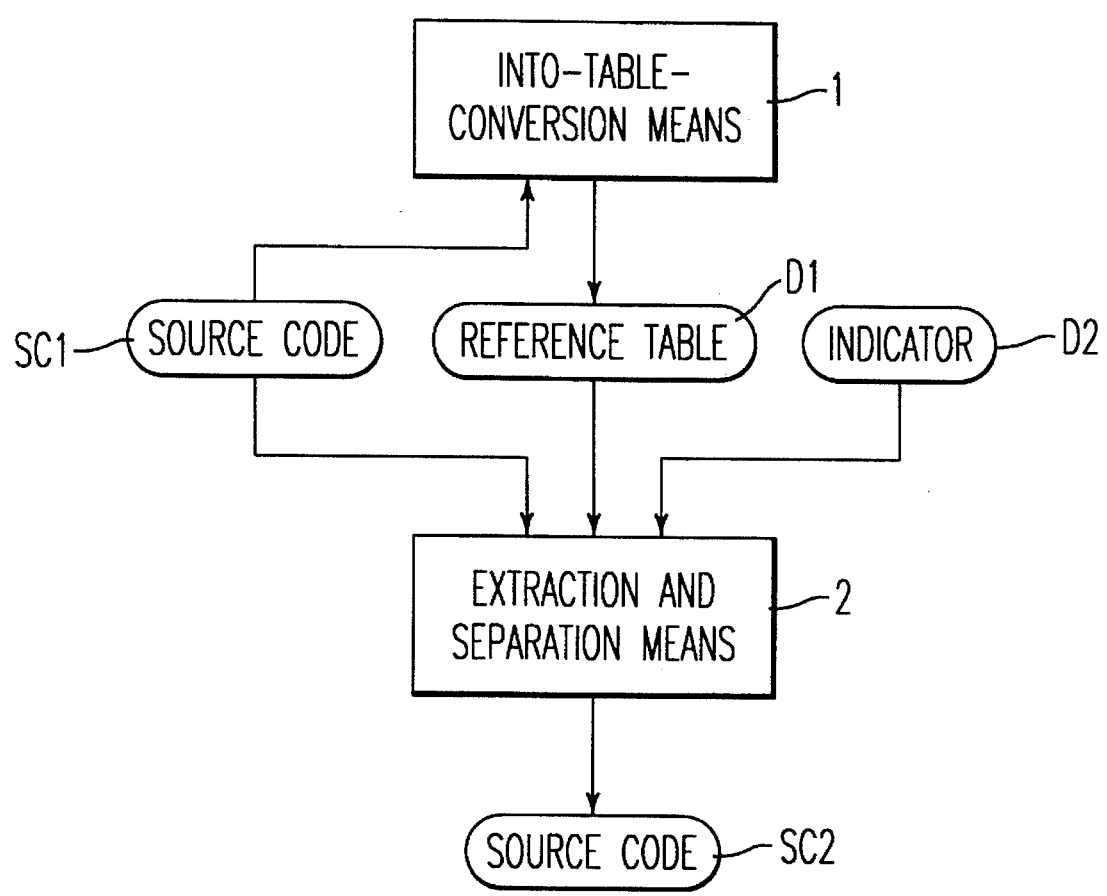
FIG. 1 is a block showing the structure of a logic description conversion apparatus according to a preferred embodiment of the present invention.

FIG. 1 is a block diagram showing the structure of a logic description conversion apparatus according to a preferred embodiment of the present invention. As shown in FIG. 1, conversion-into-table means 1 receives a source code SC1 and generates a reference table D1. The source code SC1 is a source code which is formed by logic descriptions which include a multi-clock transfer path which requires a longer time than a one-clock frequency, or a reference operation clock, in performing register-to-register data transfer. As described in the Description of the Prior Art section, if logic synthesis is performed directly on the source code SC1 as it is, synthesized logic descriptions could create a logic circuit which is not in conformity with specifications. On the other hand, the reference table D1 is a memory means in which register input control information is registered which consists of a register name, an input control condition of a register which is defined by the register name and an input data name which corresponds to the input control condition.

Figures 3, 4:
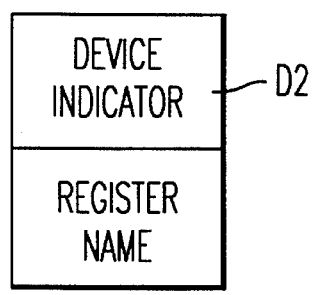
FIG. 3 is an explanatory diagram showing the structure of a reference table.
FIG. 4 is an explanatory diagram showing the structure of an indicator.

Extraction and separation means 2 converts the source code SC1 based on an indicator D2 which is inputted in advance and the reference table D1 and generates a source code SC2 which consists of sophisticated logic descriptions from which a logic circuit as it is defined by the specifications. As shown in FIG. 4, the indicator D2 is a memory means in which long-term logic input register information, i.e., the name of a receiving side register of the multi-clock transfer path, is registered. The source code SC2 is a source code which separately lists a logic description which consists of the receiving side register of the multi-clock transfer path and input control for this register and a logic description which does not include the receiving side register of the multi-clock transfer path.

Figure 2:
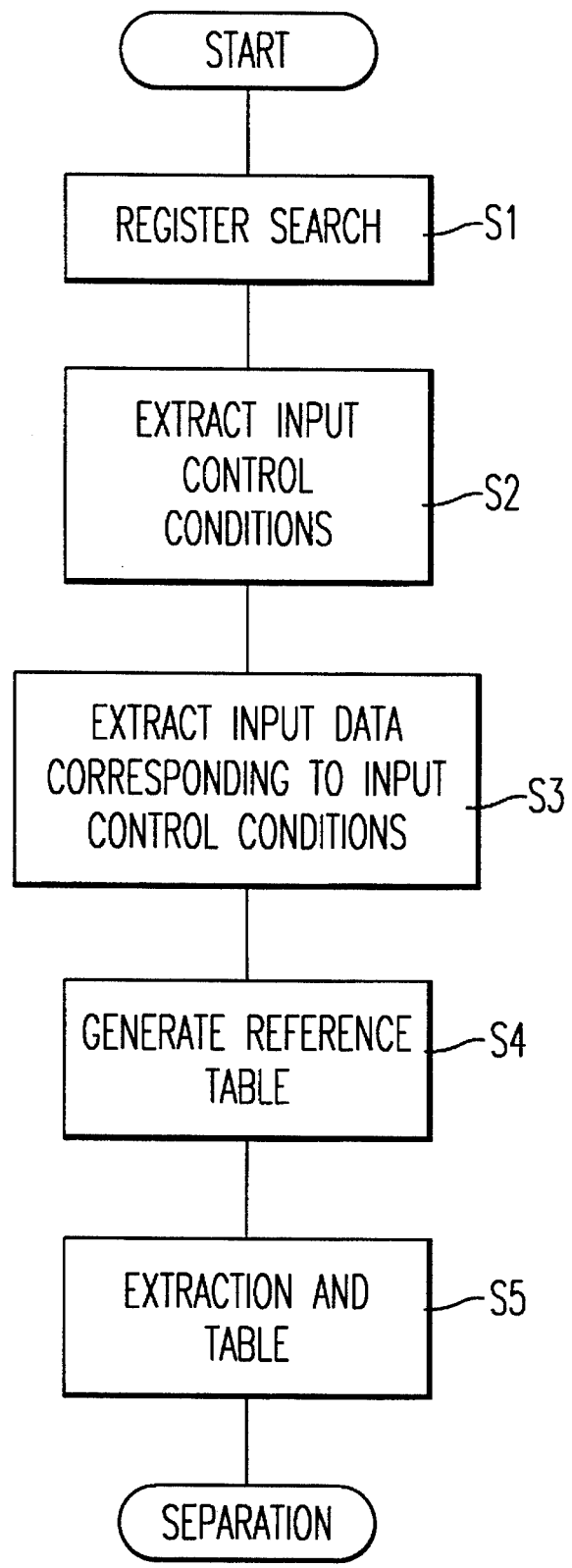
FIG. 2 is a flow chart showing a logic description conversion method which is performed by the logic description conversion apparatus of FIG. 1.
Figure 5:
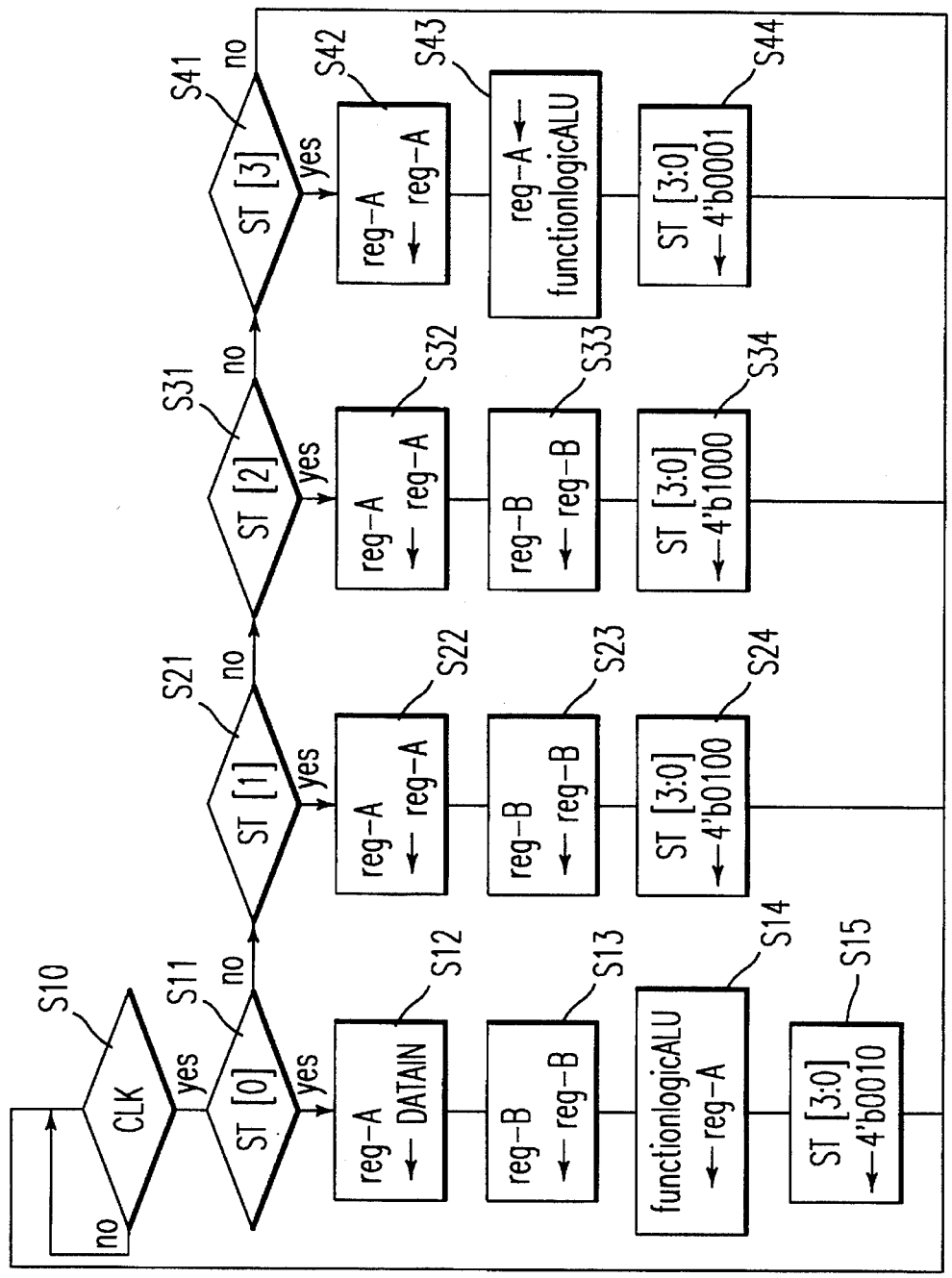
FIG. 5 is a flow chart showing an example of a source code before conversion of logic descriptions.

FIG. 2 is a flow chart showing a logic description conversion method which is performed by the logic description conversion apparatus of FIG. 1. FIG. 5 is a flow chart showing an example of logic descriptions of the source code SC1.

Figure 17:
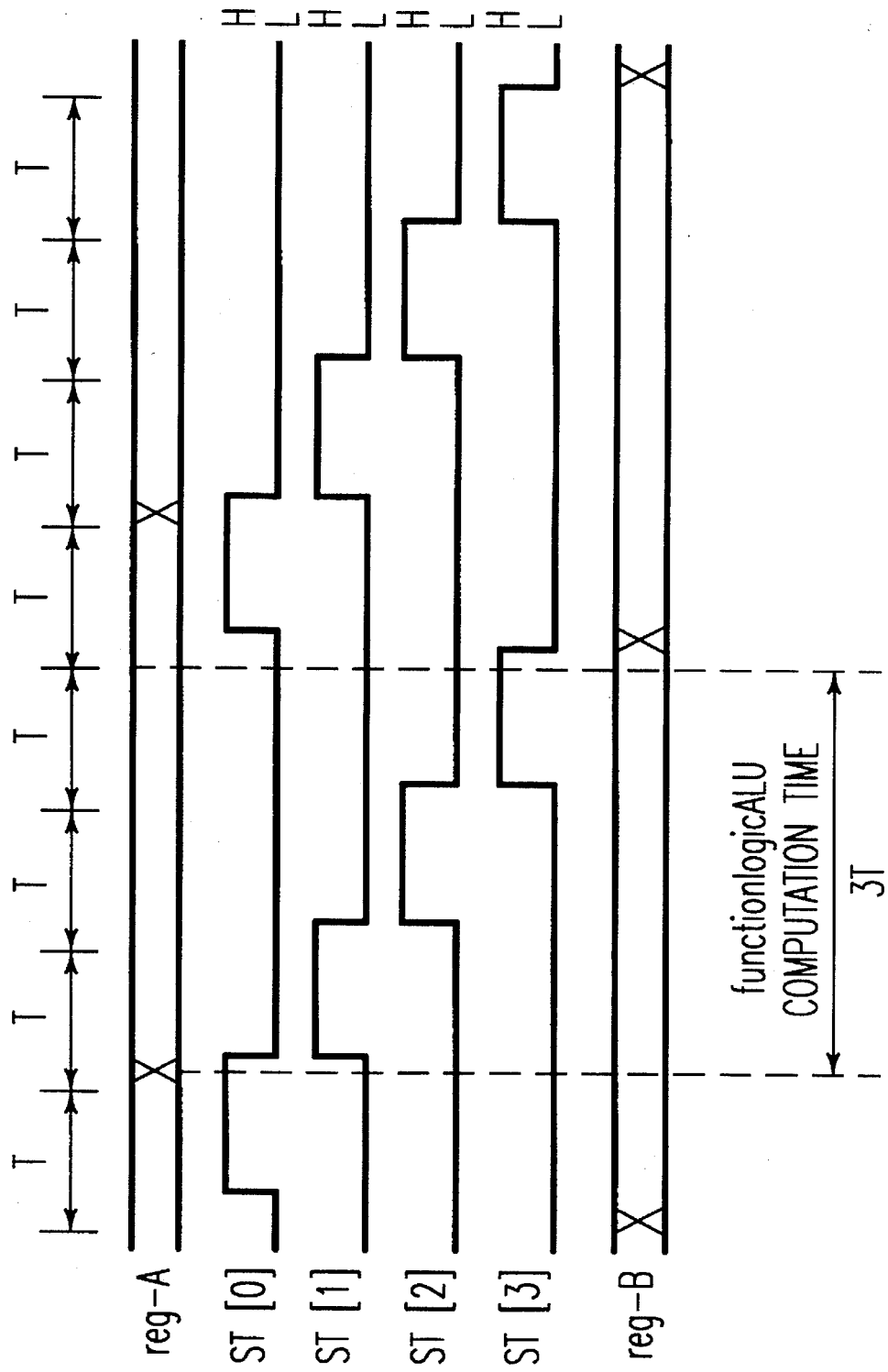
FIG. 17 is a timing chart showing an operation timing of a logic circuit which is defined by a source code.

First, the flow chart of FIG. 5 will be described. At a step S10, a rising (falling) edge of a clock input CLK is detected. After the rising edge is sensed, input control logic ST (ST[0] to ST[3]) are checked at steps S11, S12, S31 and S41. At the timing shown in FIG. 17, either one of the input control logic ST is enabled (i.e., becomes "H"). Hence, either one of the steps S11, S12, S31 and S41 is judged as enable (yes).

If yes at the step S11, the sequence proceeds to steps S12 to S15. At the step S12, input data DATAIN are entered in the register reg-A and at the step S13, stored data of the register reg-B are held as they are.

Following this, at the step S14, execution of the functionlogic ALU computation is started based on the stored data stored in the register reg-A (namely, input data DATAIN). Similarly to the conventional technique, the computation of the functionlogic/ALU is performed at the three-clock frequency 3T which is longer than the frequency of the reference operation clock (one-clock T).

Next, at the step S15, ST[3] to ST[0] are respectively set at "0," "0," "1" and "0." In other words, upon completion of the steps S12 to S15, by setting ST[1] at "1," execution of steps S22 to S24 is called for.

If yes at the step S21, at the step S22, the stored data of the register reg-A are held as they presently are, and the stored data of the register reg-B are held as they presently are at the step S23, followed by the step S24 at which ST[3] to ST[0] are respectively set at "0," "1," "0" and "0." That is, after completion of the steps S22 to S24, execution of steps S32 to S34 is called for by setting the ST[2] at "1."

If yes at the step S31, at the step S32, the stored data of the register reg-A are held as they presently are, and the stored data of the register reg-B are held as they presently are at the step S33, followed by the step S34 at which ST[3] to ST[0] are respectively set at "1," "0," "0" and "0." That is, after completion of the steps S32 to S34, execution of steps S42 to S44 is called for by setting the ST[3] at "1."

If yes at the step S41, at the step S42, the stored data of the register reg-A are held as they presently are, and the computation result of the data computation functionlogic ALU is stored in the register reg-B at the step S43, followed by the step S44 at which ST[3] to ST[0] are respectively set at "0," "0," "0" and "1." That is, after completion of the steps S42 to S44, execution of steps S12 to S15 is called for by setting the ST[0] at "1."

Figure 18:
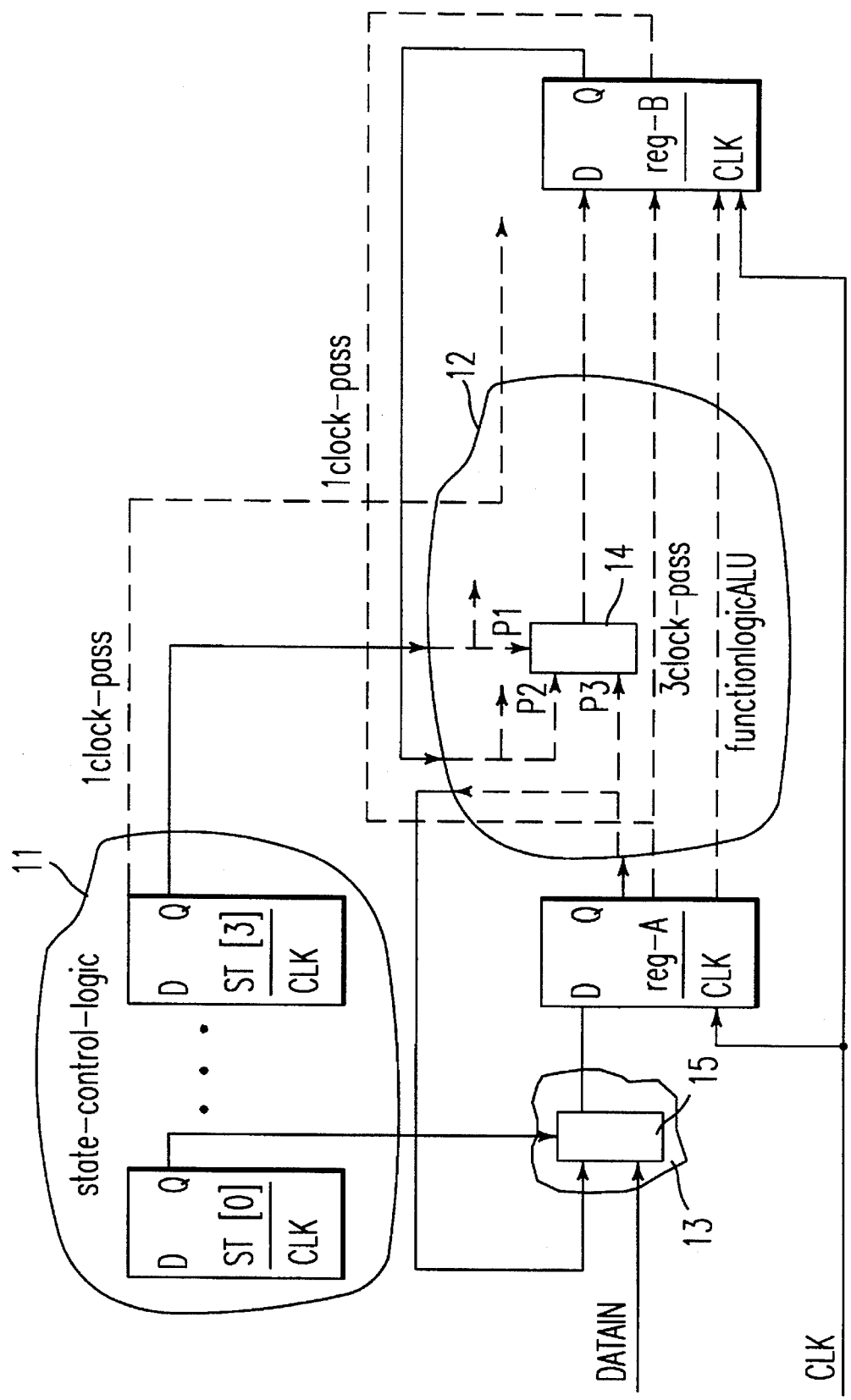
FIG. 18 is an explanatory diagram showing a logic circuit which is imaged by a conventional source code.

The logic circuit which is imaged (i.e., synthesized) using the source code SC1 as it is shown in the flow chart is the logic circuit of FIG. 18 which shows the conventional technique. Thus, the selector 14, the control computation family of the register reg-B in which the multi-clock transfer path is located at the receiving side, and the functionlogic ALU both exist in the same logic group 12.

In other words, the selector 14 which operates at one clock and the functionlogic ALU which operates at three clocks exist mixed. Hence, if logic synthesis is performed on such logic, a resulting logic circuit is very likely to be different from what is intended by the circuit designer.

In the following, explanation will be given with reference to FIG. 2 on the logic description conversion method performed by the logic description conversion method apparatus of FIG. 1. The source code SC1 shown in the flow chart of FIG. 5 and the logic circuit of FIG. 18 will be used as an example.

At a step S1, the conversion-into-table means 1 detects a register from logic descriptions which are defined by the source code SC1. For instance, in the logic circuit of FIG. 18, the registers reg-A and reg-B are detected.

At a step S2, the conversion-into-table means 1 extracts the input control conditions of the respective registers which were extracted at the step S1. The input control conditions define various conditions such as a timing at which the registers receive the input data. In the logic circuit of FIG. 18, for example, the input control condition of the register reg-A is input control logic ST[0]="1" while the input control condition of the register reg-B is input control logic ST[3]="1."

Next, at a step S3, the conversion-into-table means 1 further extracts input data which correspond to the input control conditions of the respective registers. In the logic circuit of FIG. 18, for example, the input data to be given to the register reg-A are the input data DATAIN while the input data to be given to the register reg-A are the functionlogic ALU.

Figures 6, 7:
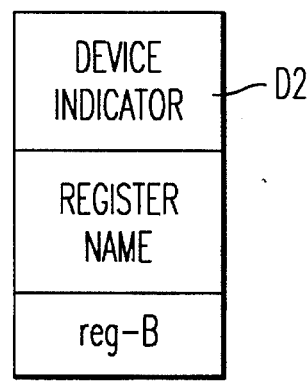
FIG. 6 is an explanatory diagram showing an example of a reference table.
FIG. 7 is an explanatory diagram showing an example of an indicator.

At a step S4, as shown in FIG. 3, the conversion-into-table means 1 registers extracted register input control information, which consists of the names of the registers which were extracted, the input control conditions (of the respective registers) and the input data (which correspond to the input control conditions), in the reference table D1. For instance, the register data of the register reg-B of the logic circuit of FIG. 18 are registered in the reference table D1 in the form as that shown in FIG. 6. In FIG. 6, the symbol "1'b1" shown as the input control condition represents 1-bit data "1."

Next, at a step S5, the extraction and separation means 2 converts the logic descriptions of the source code SC1 based on the reference table D1 and the indicator D2 and generates the source code SC2 which consists of sophisticated logic descriptions from which a logic circuit as it is exactly defined by the specifications. Detailed explanation will be given below.

The indicator D2 is information which specifies a long-term logic input register which has a multi-clock transfer path at the receiving side as shown in FIG. 4. The indicator D2 is registered manually in advance. In the logic circuit of FIG. 18, for example, since the register reg-B is a receiving side register of the multi-clock transfer path, i.e., the data computation functionlogic ALU, as shown in FIG. 7, the name of the register reg-B is registered as a long-term logic input register in the indicator D2.

Based on the reference table D1 and the indicator D2, the extraction and separation means 2 converts the logic circuit which is defined by the source code SC1 into the source code SC2 which consists of logic descriptions in which a first partial logic circuit which is formed by the receiving side register of the multi-clock transfer path and the input control logic of the same and a second partial logic circuit which includes the long-term operation logic part, i.e., the multi-clock transfer path.

Figure 8:
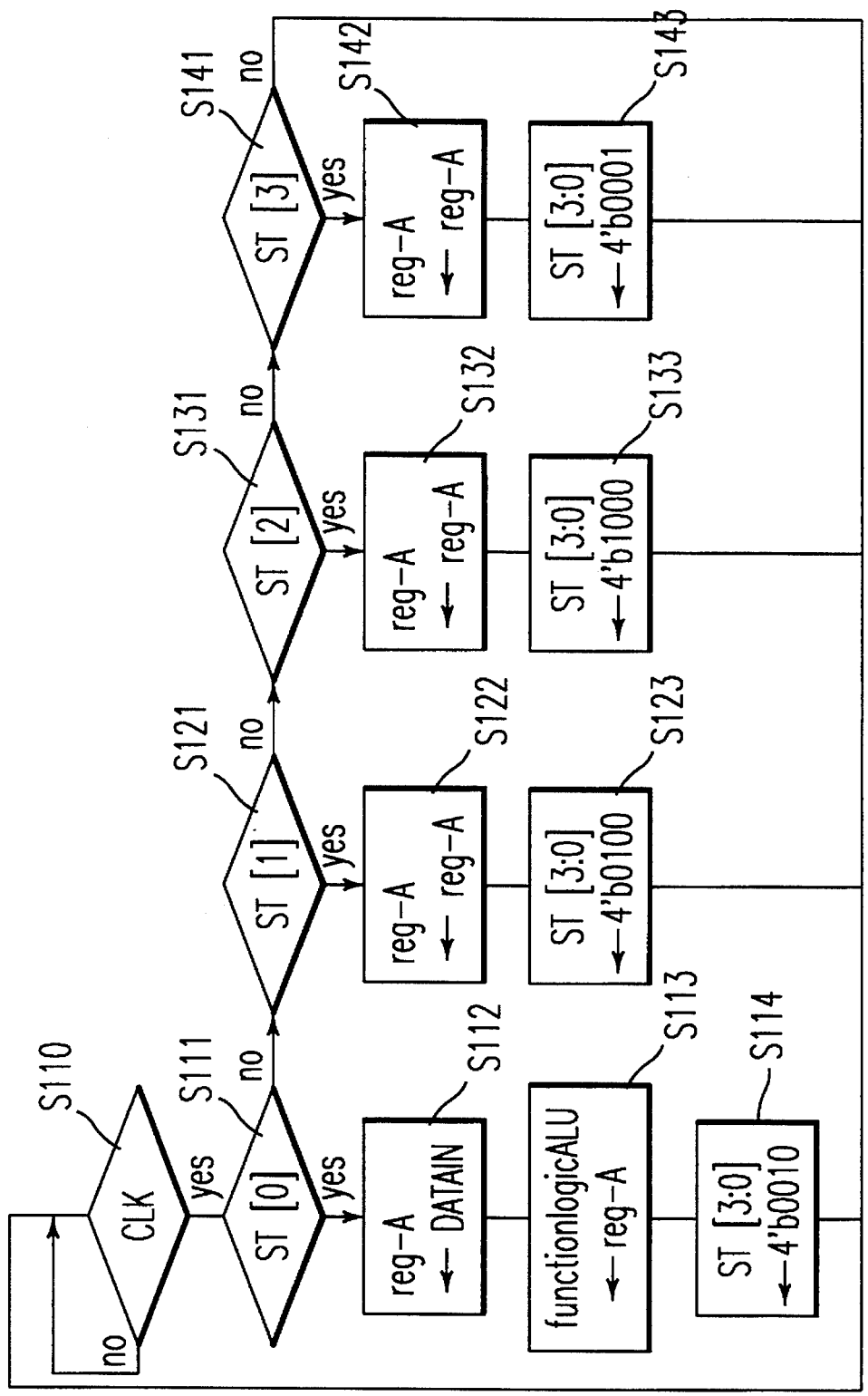
FIGS. 8 and 9 are flow charts showing an example of a source code after conversion of logic descriptions.
Figure 9:
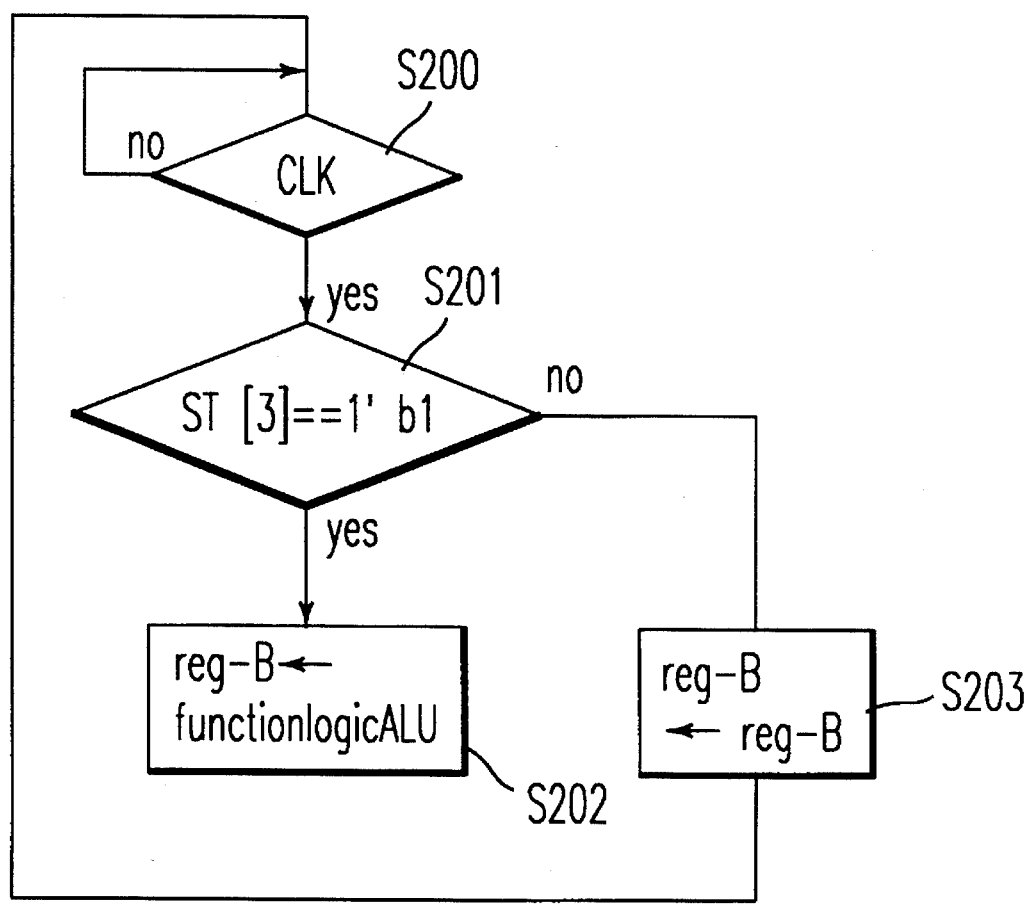
Figure 10:
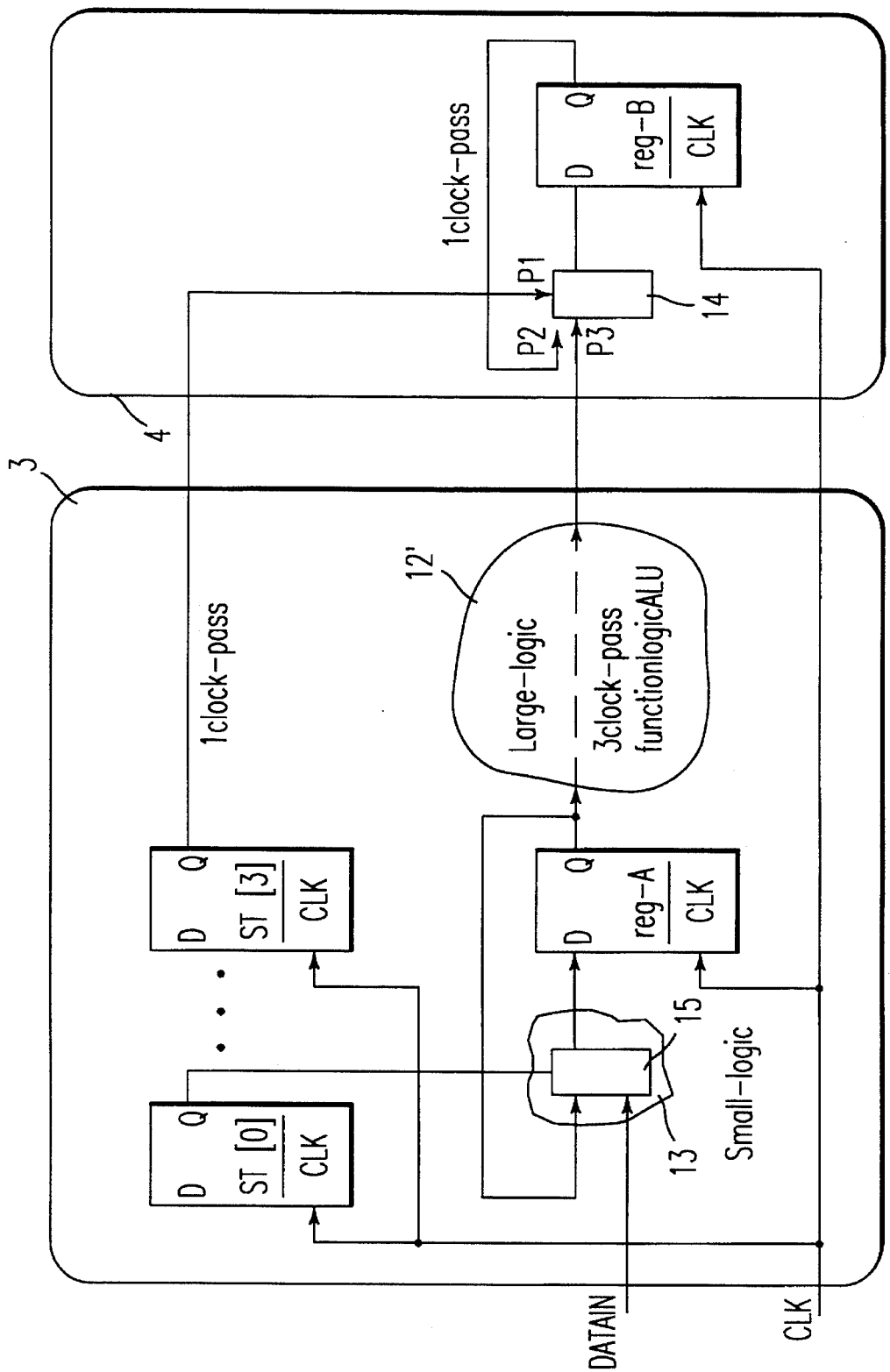
FIG. 10 is an explanatory diagram showing an example of a logic circuit which is defined by a post-logic conversion source code.

For example, in the case where the source code SC1 shown in the flow chart of FIG. 5 defines the logic circuit of FIG. 18, the source code SC1 is converted into the source code SC2 which defines the logic circuit of FIG. 10 in accordance with the flow charts of FIGS. 8 and 9.

First, the flow chart of FIG. 8 will be described. At a step S110, a rising (falling) edge of the clock input CLK is detected. Upon detection of the rising edge, input control logic ST (ST[0] to ST[3]) are checked at steps S111, S121, S131 and S141. Since one of the input control logic ST is enabled ("H") at the timing shown in FIG. 17, one of the steps S111, S121, S131 and S141 is always judged enable (yes).

If yes at the step S111, the sequence proceeds to steps S112 to S114. At the step S112, the input data DATAIN are shifted into the register reg-A, and at the subsequent step S113, execution of computation based on the functionlogic ALU is started based on the stored data of the register reg-A (namely, the input data DATAIN).

Next, at the step S114, ST[3] to ST[0] are respectively set at "0," "0," "1" and "0." That is, after completion of the steps S112 to Sl14, execution of steps S122 to S123 is instructed by setting ST[1] at "1."

If yes at the step S121, at the step S122, the stored data of the register reg-A are held as they presently are. At the step S123, ST[3] to ST[0] are respectively set at "0," "1," "0" and "0." That is, after completion of the steps S122 to S124, execution of steps S132 to S133 is instructed by setting ST[2]at "1."

If yes at the step S131, at the step S132, the stored data of the register reg-A are held as they presently are. At the step S133, ST[3] to ST[0] are respectively set at "1," "0," "0" and "0." That is, after completion of the steps S132 to S133, execution of steps S142 to S143 is instructed by setting ST[3]at "1."

If yes at the step S141, at the step S142, the stored data of the register reg-A are held as they presently are. At the step S143, ST[3] to ST[0] are respectively set at "0," "0," "0" and "1." That is, after completion of the steps S142 to S144, execution of steps S112 to S114 is instructed by setting ST[0]at "1."

Next, the flow chart or FIG. 9 will be described. At a step S200, a rising (falling) edge of the clock input CLK is detected. Upon detection of the rising edge, the sequence proceeds to a step S201.

At the step S201, the input control logic ST[3] is checked. If ST[3] is "1," the sequence proceeds to a step S202 at which the computation result of the data computation functionlogic ALU is stored in the register reg-B. The sequence then returns to the step S200.

On the other hand, if ST[3] is not "1," the sequence proceeds to a step S203 at which the content of the register reg-B is held. The sequence then returns to the step S200.

The flow chart of FIG. 8 is a flow chart which defines the second partial logic circuit including the multi-clock transfer path, and corresponds to the partial logic circuit 3 which is shown in FIG. 10. On the other hand, the flow chart of FIG. 9 is a flow chart which defines the first partial logic circuit which is comprised of the receiving side register of the multi-clock transfer path and the input control logic for the receiving side register, and therefore, corresponds to the partial logic circuit 4 which is shown in FIG. 10.

In the following, the logic circuit which is defined by the source code SC2 shown in FIG. 10 will be described. As shown in FIG. 10, in the source code SC2, the selector 14, the control computation family of the register reg-B, is formed within the partial logic circuit 4 while a data computation logic group 12' which is located at the receiving side of the register reg-B and which consists only of the data computation functionlogic ALU is formed within the partial logic circuit 3. That is, the source code SC2 is logic descriptions in which the selector 14 of the control computation family and the functionlogic ALU of the data computation family are completely separated from each other.

Thus, the logic circuit which is defined by the source code SC2 is formed by logic descriptions in which the control computation family and the data computation family regarding the same register are completely separated from each other. Hence, in which it is possible to separately control the control computation family and the data computation family. It then follows that there is no possibility that logic synthesis will result in formation of logic which is different from what is defined by the specifications.

FIGS. 11 to 14 show an example of descriptions which are written in the existing hardware description language, Verilog-HDL. FIG. 11 shows descriptions which correspond to the logic circuit of FIG. 18, FIG. 12 shows descriptions which correspond to the flow chart of FIG. 8, FIG. 13 shows descriptions which correspond to the flow chart of FIG. 9 and FIG. 14 shows descriptions which correspond to the logic circuit of FIG. 10. The descriptions of FIG. 14 include a module subroutineA shown in FIG. 12 and a module subroutineB shown in FIG. 13. The symbols "regA" and "regB" respectively represent the register reg-A and the register reg-B.

The source code SC1, in which the control computation family and the data computation family relevant to the register reg-B exist mixed altogether as can be seen at mainroutineC in FIG. 11, is converted into the source code SC2 in which the module subroutineA of the control computation family and the module subroutineB of the data computation family regarding the register reg-B are completely separated from each other as can be seen at mainroutineA in FIG. 14.

Thus, since the source code SC2 is logic descriptions which can separately control the control computation family and the data computation family regarding the register reg-B, even if the operation clocks for the control computation family and the data computation family are different from each other, logic which is different from what is defined by the specification will never be synthesized by logic synthesis.

Figure 15:
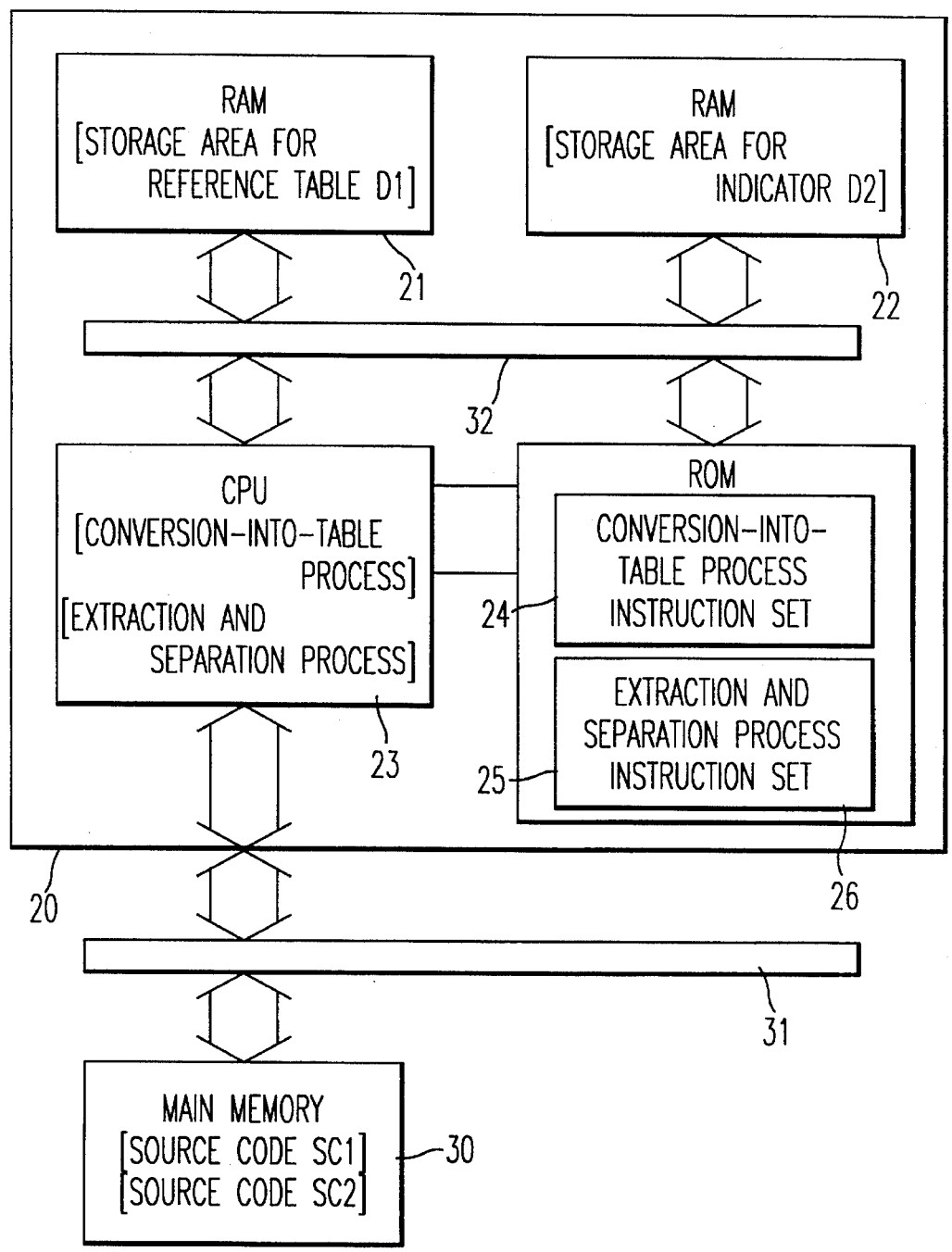
FIG. 15 is a block diagram showing an example where the logic description conversion apparatus according to the preferred embodiment is formed by a microcomputer.
Figure 16:
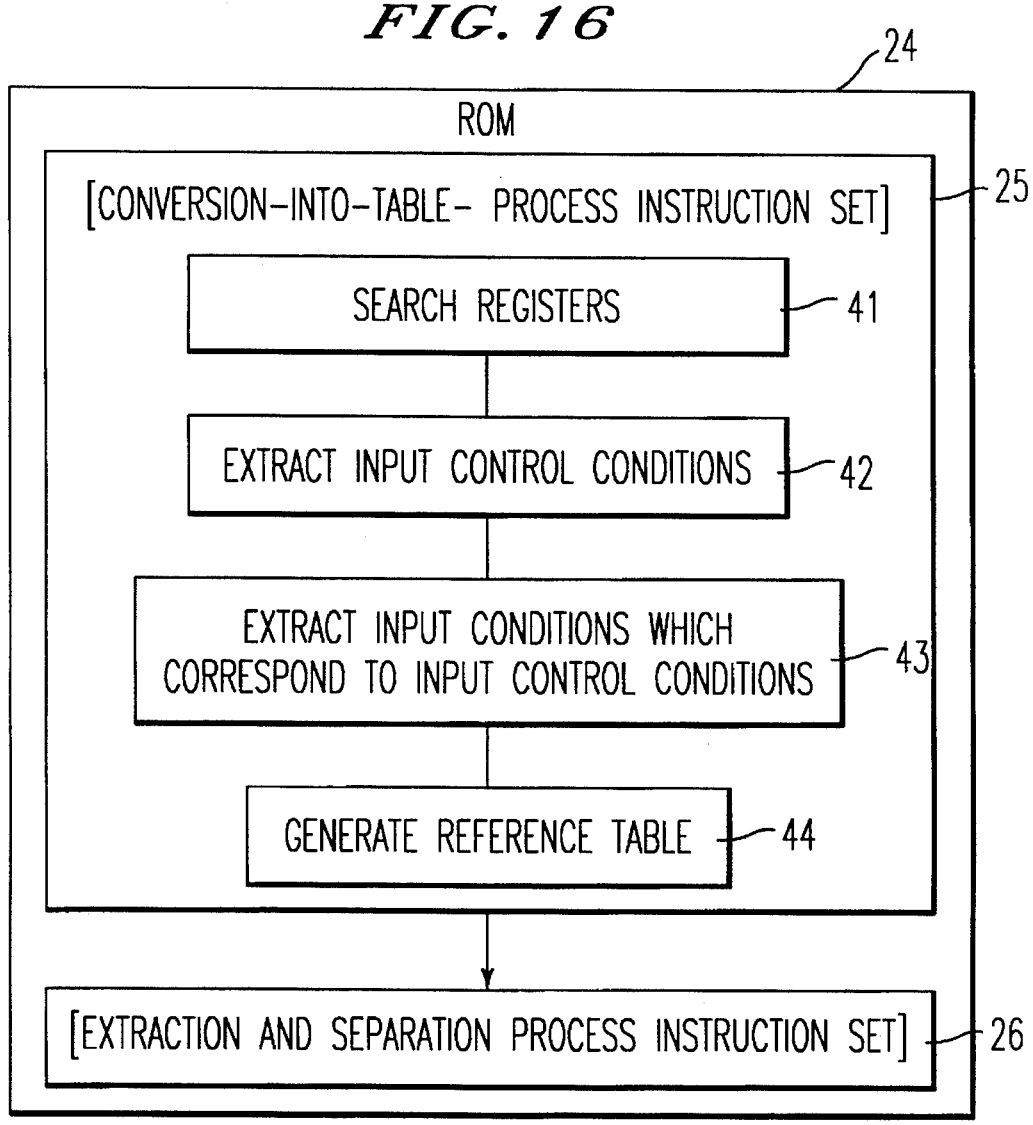
FIG. 16 is a block diagram showing the details of the inner structure of a ROM of FIG. 15.

FIGS. 15 and 16 are block diagrams showing an example of application of the logic description conversion apparatus of the present invention to a microcomputer.

As shown in FIG. 15, the microcomputer is comprised of a one-chip computation process part 20 and a main memory 30. The computation process part 20 is formed by RAMs 21 and 22, a CPU 23 and a ROM 24. The RAM 21 is an area in which the reference table D1 is to be stored while the RAM 22 is an area in which the indicator D2 is to be stored. The ROM 24 stores a conversion-into-table process instruction set 25 in which the conversion-into-table method is programmed and an extraction and separation process instruction set 26 in which the extraction and separation process is programmed.

The conversion-into-table process instruction set 25 is, as shown in FIG. 16, comprised of a register search process 41, an input control condition extraction process 42, an input control condition extraction process 43 corresponding to the input control conditions and a reference table generation process 44. The processes 41 to 44 each include an instruction set which corresponds to the steps S1 to S4 of the flow chart of FIG. 2. The separation process instruction set 26 includes an instruction set which corresponds to the step S5 of the flow chart of FIG. 2.

On the other hand, the main memory 30 is formed by a hard disk and functions as an area for storing the source code SC1 and the source code SC2. Data transfer between the CPU 23 and the internal memories 21, 22 and 24 is achieved through an internal bus 32 while data transfer between the CPU 23 and the main memory 30, or an external memory, is achieved through an external bus 31.

In such a construction, in accordance with an instruction which is defined in the conversion-into-table process instruction set 25, the CPU 23 enters into the RAM 21 the reference table D1 which is formed by the extracted register input control information which was obtained from the source code SC1. Further, in accordance with an instruction which is defined in the separation process instruction set 26 and in light of the reference table D1 and the indicator D2, the CPU 23 converts the source code SC1 into the source code SC2 and enters the source code SC2 in the main memory 30.

Although Verilog-HDL is used as a hardware description language to write the logic descriptions of the source code SC1 in this embodiment, the hardware description language is not limited to Verilog-HDL. Needless to mention, the present invention is also applicable to where the logic descriptions of the source code SC1 are written in the language C.

While the invention has been described in detail, the foregoing description is in all aspects illustrative and not restrictive. It is understood that numerous other modifications and variations can be devised without departing from the scope of the invention.

I claim:

1. A logic description conversion apparatus for converting logic descriptions from which a logic circuit is formed by logic synthesis into higher level logic descriptions from which a logic circuit exactly defined in specifications is created, comprising:

logic description providing means for providing first logic descriptions which define at least one long-term operation logic part which performs data computation at a clock which is longer than a reference operation clock and for providing second logic descriptions which define at least one reference term operation logic part which performs data computation at the reference clock;

long-term logic input register information providing means for providing long-term logic input register information which designates a register which has said long-term operation logic part at a receiving side of registers which are defined by said first logic descriptions as a long-term logic input register;

extracted register input control information generating means for extracting a description which serves as a register from said first logic descriptions as an extracted register and for generating extracted register input control information in which said extracted register is made correspondence to input control logic which designates an input timing for said extracted register; and logic description conversion means for converting said first logic descriptions into third logic descriptions based on said long-term logic input register information and said extracted register input control information and outputting said third logic descriptions, said third logic descriptions being logic descriptions in which said input control logic of said long-term logic input register and said long-term operation logic part of a receiving side of said long-term logic input register are logically separated from each other.

2. The logic description conversion apparatus of claim 1, wherein said long-term logic input register information consists of a name which specifies said extracted register, information about said input control logic of said extracted register and input data to be given to said extracted register.

3. The logic description conversion apparatus of claim 2, wherein said logic description providing means comprises first memory means in which said first logic descriptions are stored and said long-term logic input register information providing means comprises second memory means in which said long-term logic input register information is stored, and wherein said logic description conversion apparatus further comprises third memory means for temporarily storing said extracted register input control information.

4. The logic description conversion apparatus of claim 3 which is formed by a microcomputer, wherein said extracted register input control information generating means is a CPU which operates in accordance with a preliminarily prepared first program, and wherein said logic description conversion means is said CPU which operates in accordance with a preliminarily prepared second program.

5. The logic description conversion apparatus of claim 4, further comprising fourth memory means in which said first and said second programs are stored.

6. The logic description conversion apparatus of claim 5, wherein said first and said second memory means are RAMs, said third memory means is a hard disk, said fourth memory means is a ROM, and wherein said first, said second and said fourth memory means and said CPU are formed as one computation processing part of single chip.

7. A logic description conversion method of converting logic descriptions from which a logic circuit is formed by logic synthesis into higher level logic descriptions from which a logic circuit exactly defined in specifications is created, comprising the steps of:

(a) providing first logic descriptions which define at least one long-term operation logic part which performs data computation at a clock which is longer than a reference operation clock and for providing second logic descriptions which define at least one reference term operation logic part which performs data computation at the reference clock;

(b) extracting a description which serves as a register from said first logic descriptions as an extracted register and for generating extracted register input control information in which said extracted register is made correspondence to input control logic which designates an input timing for said extracted register; and (c) based on long-term logic input register information, which designates a register which has said long-term operation logic part at a receiving side of registers which are defined by said first logic descriptions as a long-term logic input register, and said extracted register input control information, converting said first logic descriptions into third logic descriptions in which said input control logic of said long-term logic input register and said long-term operation logic part of a receiving side of said long-term logic input register are logically separated from each other.

8. The logic description conversion method of clam 7, wherein said step (a) comprises the steps of:

(a-1) extracting a description which will serve as a register from said first logic descriptions as an extracted register;

(a-2) extracting information about said input control logic of said extracted register;

(a-3) extracting input data to be given to said extracted register; and (a-4) outputting said extracted register input control information in which said extracted register, said information about said input control logic and said input data are stored as a set.

* * * * *